United States Patent
Inoue et al.

(10) Patent No.: US 8,441,016 B2
(45) Date of Patent: May 14, 2013

(54) THIN-FILM TRANSISTOR, DISPLAY DEVICE, AND MANUFACTURING METHOD FOR THIN-FILM TRANSISTORS

(75) Inventors: Tsuyoshi Inoue, Osaka (JP); Tohru Okabe, Osaka (JP); Tetsuya Aita, Osaka (JP); Michiko Takei, Osaka (JP); Yoshiyuki Harumoto, Osaka (JP); Takeshi Yaneda, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 4 days.

(21) Appl. No.: 13/383,077

(22) PCT Filed: Jul. 8, 2010

(86) PCT No.: PCT/JP2010/061606
§ 371 (c)(1),
(2), (4) Date: Jan. 9, 2012

(87) PCT Pub. No.: WO2011/007711
PCT Pub. Date: Jan. 20, 2011

(65) Prior Publication Data
US 2012/0104406 A1     May 3, 2012

(30) Foreign Application Priority Data
Jul. 14, 2009   (JP) ................................ 2009-166005

(51) Int. Cl.
*H01L 33/08*     (2006.01)
(52) U.S. Cl.
USPC ...................... 257/72; 257/E33.053; 438/34
(58) Field of Classification Search .................... 257/72, 257/E33.053
See application file for complete search history.

(56) References Cited

U.S. PATENT DOCUMENTS

| 6,121,660 A | 9/2000 | Yamazaki et al. |
| 2010/0025679 A1* | 2/2010 | Yamazaki et al. ............... 257/43 |

FOREIGN PATENT DOCUMENTS

| JP | 5-335580 A | 12/1993 |
| JP | 7-30115 A | 1/1995 |
| JP | H9-129888 A | 5/1997 |
| JP | H9-326495 A | 12/1997 |
| JP | 10-256554 A | 9/1998 |
| JP | 11-103068 A | 4/1999 |

* cited by examiner

*Primary Examiner* — Zandra Smith
*Assistant Examiner* — Paul Patton
(74) *Attorney, Agent, or Firm* — Chen Yoshimura LLP (57) ABSTRACT

Disclosed is a high-quality, efficiently manufacturable thin film transistor in which leakage current is minimized. The thin film transistor is provided with a semiconductor layer (34) that contains a channel region (34C) having a microcrystalline semiconductor; source and drain contact layers (35S and 35D) that contains impurities; a first source metal layer (36S) and a first drain metal layer (36D), and a second source metal layer (37S) and a second drain metal layer (37D). The end portion of the second metal source layer (37S) is located at a position receded from the end portion of the first metal source layer (36S) and the end portion of the second drain metal layer (37D) is located at a position receded from the end portion of the first drain metal layer (36D). The semiconductor layer (34) contains low concentration impurity diffusion regions formed near the end portions of the aforementioned source contact layer (35S) and drain contact layer (35D).

11 Claims, 6 Drawing Sheets

THIN-FILM TRANSISTOR, DISPLAY DEVICE, AND MANUFACTURING METHOD FOR THIN-FILM TRANSISTORS

TECHNICAL FIELD

The present invention relates to a thin film transistor (TFT). More particularly, the present invention relates to a thin film transistor used in a display device such as a liquid crystal display device, an organic EL display device, or the like and a display device provided with such a thin film transistor.

BACKGROUND ART

Conventionally, non-crystalline (amorphous) silicon TFTs (Thin Film Transistors), microcrystalline silicon TFTs, polycrystalline silicon (polysilicon) TFTs, or the like have been used as TFTs for an active matrix substrate in a display device such as a liquid crystal display device and the like.

Amorphous silicon TFTs are suitable for TFTs of a display device that requires a large region because forming an amorphous silicon film is relatively easy. Accordingly, the amorphous silicon TFTs are used in many of active matrix substrates of liquid crystal televisions having a relatively large screen.

In a microcrystalline silicon TFT and a polycrystalline silicon TFT, the mobilities of electrons and holes in a semiconductor layer are high and an on-current is large. Thus, there is an advantage that a pixel capacitance of a liquid crystal display device or the like can be charged within a short switching time. Also, if microcrystalline silicon TFTs and polycrystalline silicon TFTs are used, there is an advantage that a part or all of peripheral circuits such as a driver and the like can also be fabricated in an active matrix substrate.

Figure 7:
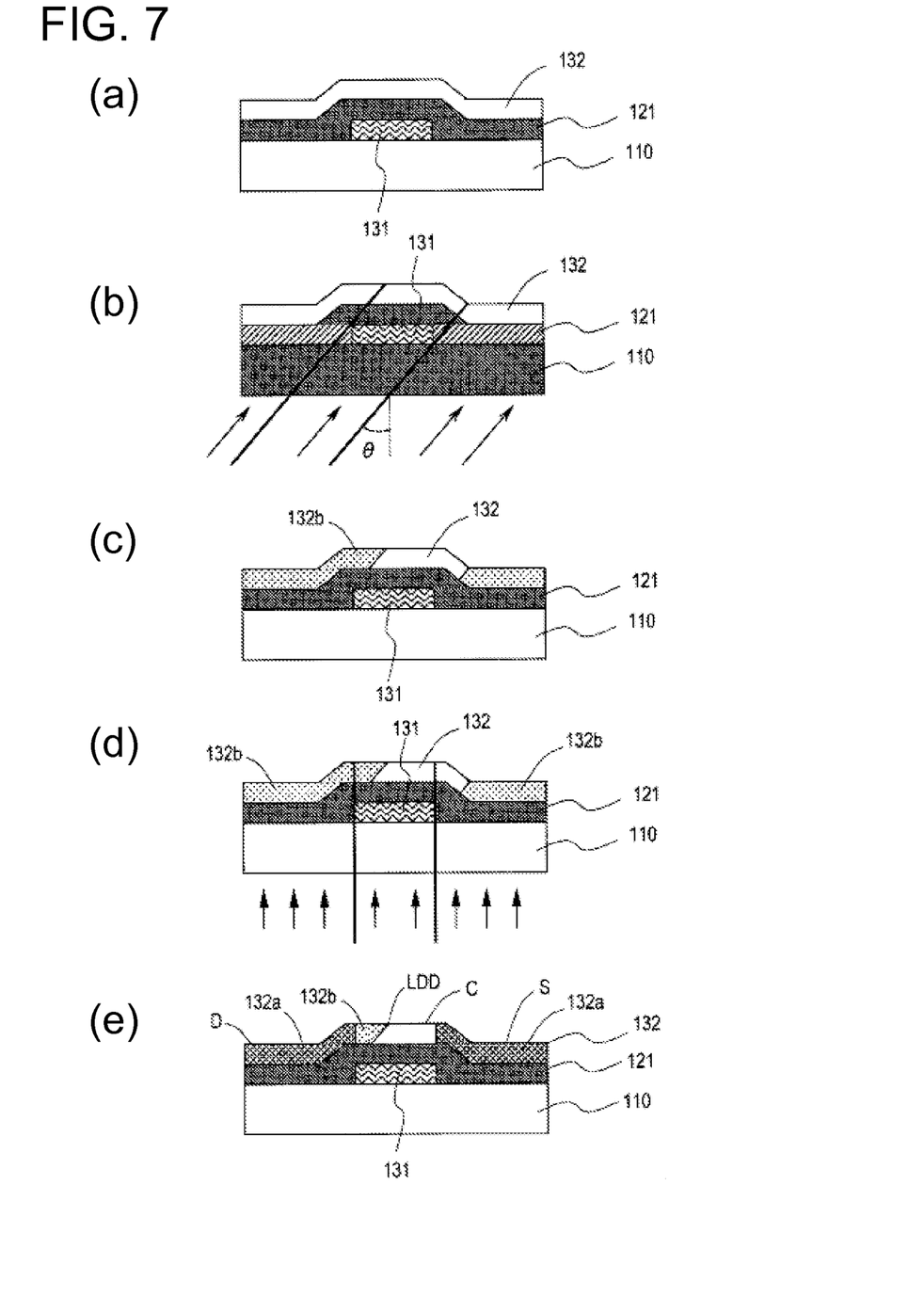
FIGS. 7(a) to 7(e) are cross sectional views for describing the manufacturing method of the TFT described in Patent Document 1.

Manufacturing methods of a polycrystalline silicon TFT are described in Patent Document 1 and Patent Document 2. Patent Document 1 relates to a manufacturing method of a bottom gate type TFT and Patent Document 2 relates to a manufacturing method of a top gate type TFT. FIG. 7 is a cross sectional view showing a manufacturing method of a TFT described in Patent Document 1.

In the manufacturing method of a TFT described in Patent Document 1, initially, a conductive layer is formed on a substrate 110, and then, a gate electrode 131 is formed by patterning the conductive layer using the photolithography. After that, an insulating layer 121 is formed by depositing silicon dioxide or the like by a CVD method. Next, after depositing a silicon layer made of polysilicon or amorphous silicon on the insulating layer 121, a semiconductor layer 132 is formed by patterning the silicon layer using the photolithography. This way, a structure shown in FIG. 7(a) is obtained.

Next, as shown in FIG. 7(b), the structure is irradiated with laser light from a side of the substrate 110 at an oblique angle with respect to a substrate surface. The irradiation angle θ of the laser light with respect to the substrate surface is set to be 10 to 80°. By this laser light irradiation, the semiconductor layer 132 is heated using the gate electrode 131 as a mask and a part of the semiconductor layer 132 is melted. In case of forming a N type MOS, arsine ($AsH_3$), phosphine ($PH_3$), or the like, and in case of forming a P type MOS, diborane ($B_2H_6$), phosphorus trichloride ($PCl_3$), boron fluoride ($BF_3$) or the like is introduced as an ambient gas at this time. This way, an impurity in the ambient gas is doped only into the melted part of the semiconductor layer 132, and a low concentration impurity diffusion region 132b is formed as shown in FIG. 7(c).

After this, in the atmosphere where the ambient gas including an impurity is present, a second laser light irradiation using the gate electrode 131 as a mask is performed from a direction normal to the surface of the substrate 110, as shown in FIG. 7(d). By the second irradiation, parts of the semiconductor layer 132 except for the part blocked by the gate electrode 131 are melted. At this time, the impurity in the ambient gas is doped into the melted parts and high concentration impurity diffusion regions 132a of a source region (S) and a drain region (D) are formed, as shown in FIG. 7(e).

In the low concentration impurity diffusion region 132b that was formed by the first laser light irradiation, the part that was not irradiated with the second laser light remains as the low concentration impurity diffusion region 132b. This part becomes a low concentration diffusion drain (LDD: Lightly Doped Drain). The LDD is only formed in one location in the drain region. The part of the semiconductor layer 132 that was not irradiated with either first or second laser light becomes a channel region (C) having no impurity doped therein.

The TFT formed as described above is assumed to be manufacturable with a small number of steps because the LDD, source, and drain are formed in the thin film transistor of the bottom gate structure in a self-aligned manner. Also, a leak current can be decreased because an electric field concentration in the vicinity of a junction of the channel region and the drain region can be reduced by the LDD.

RELATED ART DOCUMENTS

Patent Documents

Patent Document 1: Japanese Patent Application Laid-Open Publication No. H9-129888
Patent Document 2: Japanese Patent Application Laid-Open Publication No. H9-326495

SUMMARY OF THE INVENTION

Problems to be Solved by the Invention

However, since the aforementioned manufacturing method of a TFT requires two laser irradiation steps, there is a problem of low manufacturing efficiency.

Also, a high mobility can be obtained by a TFT having a channel region made of polycrystalline silicon. However, carriers are more likely to be excited because electric fields are concentrated between a gate electrode and an end portion of a source electrode and between the gate electrode and an end portion of a drain electrode. Thus, there is a problem that a leak current is generated. In the TFT formed by the aforementioned method, an LDD is formed only on the drain electrode side. Thus, the leak current on the drain electrode side is suppressed. However, there was a problem that the leak current of the source electrode side cannot be suppressed.

Also, in the case of manufacturing a display device having a plurality of such TFTs, direction of the second laser irradiation is held constant with respect to all of the TFTs. Accordingly, there was a problem that the manufacturing method of these TFTs can only be applied to a display device in which orientations of all of the TFTs are same.

The present invention is devised by considering the aforementioned problems. An object of the invention is to provide a high performance TFT having a suppressed leak current with high manufacturing efficiency.

Means for Solving the Problems

A thin film transistor of the present invention has a gate electrode formed on a substrate, an insulating layer formed so as to cover the gate electrode, a semiconductor layer that has a channel region made from a polycrystalline semiconductor or a microcrystalline semiconductor and that is formed on the insulating layer, a source contact layer and a drain contact layer that are made of a semiconductor including impurities and that are formed on the insulating layer so as to contact the semiconductor layer, a first source metal layer formed on the source contact layer, a first drain metal layer formed on the drain contact layer, a second source metal layer formed on the first source metal layer, and a second drain metal layer formed on the first drain metal layer, wherein an end portion of the second source metal layer on a side of the channel region is located at a position that is receded from an end portion of the first source metal layer on the side of the channel region, wherein an end portion of the second drain metal layer on a side of the channel region is located at a position that is receded from an end portion of the first drain metal layer on the side of the channel region, wherein the semiconductor layer contains low concentration impurity diffusion regions formed adjacent to the end portions of the source contact layer and the drain contact layer on the side of the channel region, and wherein an impurity concentration of the low concentration impurity diffusion region is lower than an impurity concentration of the source contact layer and the drain contact layer.

In a certain embodiment, at lease portions of the low concentration impurity diffusion regions are respectively formed between the end portion of the second source metal layer and the end portion of the first source metal layer, and between the end portion of the second drain metal layer and the end portion of the first drain metal layer as viewed in a direction normal to a surface of the substrate.

In a certain embodiment, the distance between the end portion of the first source metal layer and the end portion of the second source metal layer and the distance between the end portion of the first drain metal layer and the end portion of the second drain metal layer are equal to or more than 50 nm and equal to or less than 200 nm.

In a certain embodiment, the thickness of the first source metal layer and the first drain metal layer is equal to or greater than 30 nm and equal to or less than 100 nm.

In a certain embodiment, the first source metal layer and the first drain metal layer are made of titanium and the second source metal layer and the second drain metal layer are made of aluminum.

A display device in the present invention is provided with a TFT substrate in which the thin film transistor as described above is disposed on each pixel.

A manufacturing method of a thin film transistor of the present invention includes forming a gate electrode on a substrate, forming an insulating layer so as to cover the gate electrode, forming a first semiconductor layer on the insulating layer, forming a second semiconductor layer including impurities on the first semiconductor layer, forming a first metal layer on the second semiconductor layer, forming a second metal layer on the first metal layer, performing a pattering step that includes patterning the second metal layer so as to form a second source metal layer and a second drain metal layer, and patterning the first metal layer so as to form a first source metal layer and a first drain metal layer, patterning the second semiconductor layer so as to form a source contact layer underneath the first source metal layer, and to form a drain contact layer underneath the first drain metal layer, respectively, and irradiating the first semiconductor layer with light from a side of the second metal layer so as to form a channel region made of a polycrystalline semiconductor or a microcrystalline semiconductor in the first semiconductor layer, wherein in the patterning step, an end portion of the second source metal layer is formed at a position receded from an end portion of the first source metal layer on a side of the channel region, and an end portion of the second drain metal layer is formed at a position receded from an end portion of the first drain metal layer on a side of the channel region, wherein in the light irradiating step, low concentration impurity diffusion regions are respectively formed in the first semiconductor layer underneath the source contact layer and the drain contact layer, and wherein an impurity concentration of the low concentration impurity diffusion regions is lower than an impurity concentration of the source contact layer and the drain contact layer.

In a certain embodiment, the first metal layer and the second metal layer are patterned in the patterning step so that the distance between the end portion of the first source metal layer and the end portion of the second source metal layer, and the distance between the end portion of the first drain metal layer and the end portion of the second drain metal layer are equal to or greater than 50 nm and equal to or less than 200 nm.

In a certain embodiment, the second source metal layer, the second drain metal layer, the first source metal layer, and the first drain metal layer are formed by etching the second metal layer and the first metal layer in one wet etching treatment in the patterning step.

In a certain embodiment, the first source metal layer and the first drain metal layer are made of titanium, and the second source metal layer and the second drain metal layer are made of aluminum.

In a certain embodiment, the patterning step includes a first step of forming the second source metal layer and the second drain metal layer from the second metal layer by photolithography, and a second step of forming the first source metal layer and the first drain metal layer from the first metal layer by photolithography.

Here, the invention of the present application also includes a circuit substrate having the thin film transistor of the present invention and also includes a circuit substrate having the thin film transistor manufactured by the manufacturing method of the present invention. In addition, the invention of the present application also includes a display device such as a liquid crystal display device, an organic EL (electroluminescence) display device, and the like, and an imaging device that have such a circuit substrate.

Effects of the Invention

According to the present invention, since the low concentration impurity diffusion regions are formed in the first semiconductor layer under the source contact layer and the drain contact layer, both of the electric field concentrations between the gate electrode and the source electrode and between the gate electrode and the drain electrode can be reduced. Also, the low concentration impurity diffusion regions are both formed by one laser irradiation. Therefore, according to the present invention, it becomes possible to provide a high performance TFT having reduced leak currents in both the source region and the drain region with high manufacturability by the present invention.

DETAILED DESCRIPTION OF EMBODIMENTS

Below, a liquid crystal display device 1, a TFT 30, and a method of manufacturing a TFT are described by referring to the drawings. However, the scope of the present invention is not limited to embodiments described below.

Figure 1:
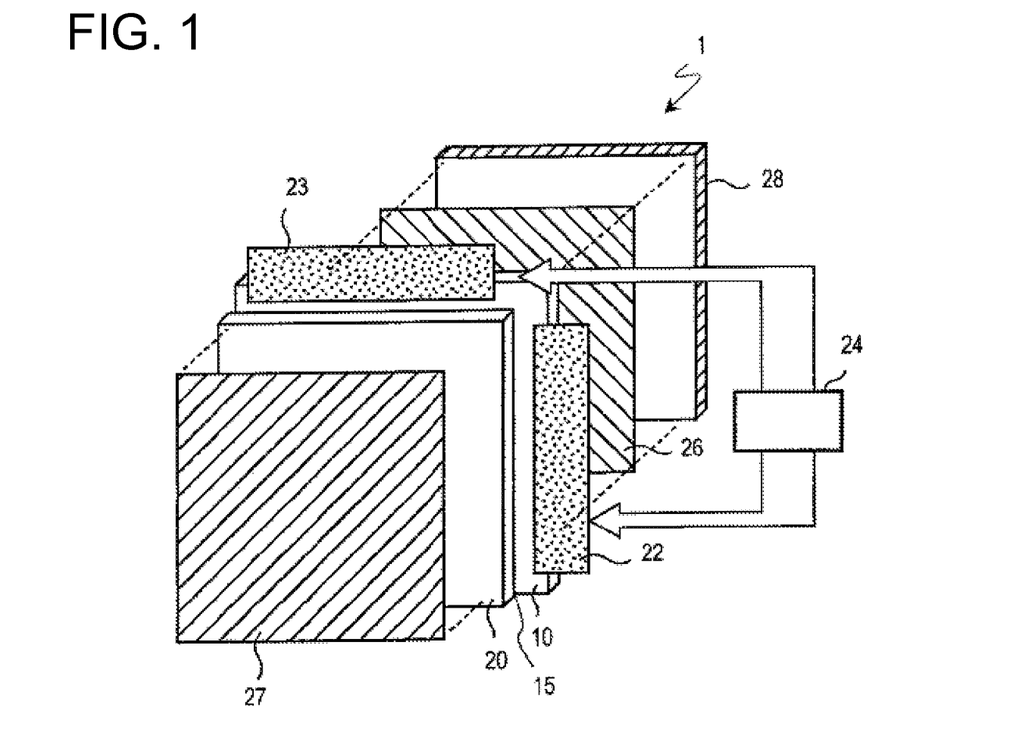
FIG. 1 is a schematic perspective view showing a configuration of a liquid crystal display device 1 according to an embodiment of the present invention.
Figure 2:
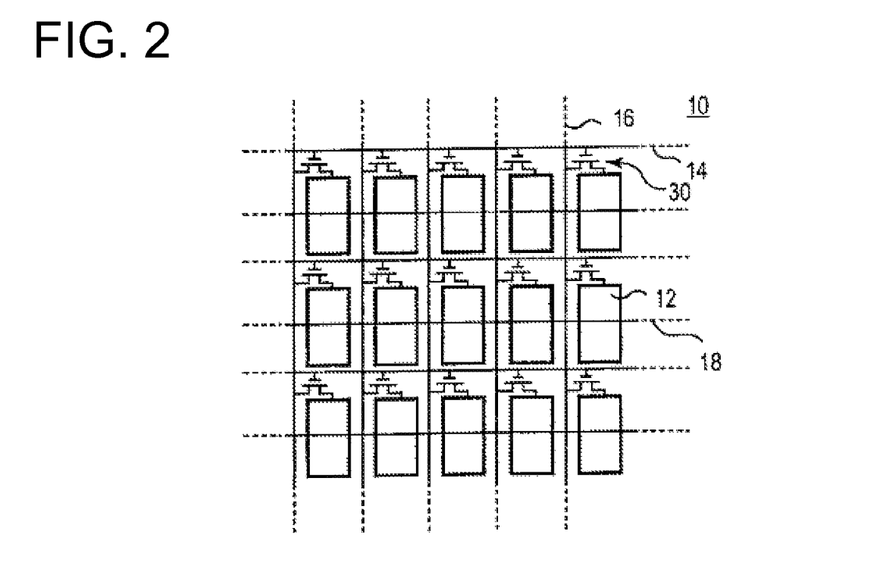
FIG. 2 is a schematic plan view showing a configuration of a TFT substrate 10 in the liquid crystal display device 1.

FIG. 1 is a schematic perspective view showing a configuration of a liquid crystal display device 1 and FIG. 2 is a schematic plan view showing a configuration of a TFT substrate 10 of the liquid crystal display device 1.

As shown in FIG. 1, the liquid crystal display device 1 has the TFT substrate 10 and an opposite substrate (CF substrate) 20 that are sandwiching a liquid crystal layer 15 and facing each other, polarizing plates 26 and 27 that are disposed on respective outer sides of the TFT substrate 10 and the opposite substrate 20, and a backlight unit 28 irradiating the polarizing plate 26 with light for display.

As shown in FIG. 2, a plurality of scan lines (gate bus lines) 14 and a plurality of signal lines (data bus lines) 16 are disposed on the TFT substrate 10 so that they are crossing each other perpendicularly. A TFT 30, which is an active element, is formed in each pixel near each of the crossing points of the plurality of scan lines 14 and the plurality of signal lines 16. Here, one pixel is defined as an region bounded by two adjacent scan lines 14 and two adjacent signal lines 16. A pixel electrode 12 made of ITO (Indium Tin Oxide), for example, that is connected electrically to a drain electrode of the TFT 30 is disposed in each pixel. An auxiliary capacitance line (accumulated capacitance line, also referred to as a Cs line) 18 that extends in parallel with the scan lines may be disposed between the two adjacent scan lines 14.

The plurality of scan lines 14 and the plurality of signal lines 16 are connected respectively to a scan line driver circuit 22 and a signal line driver circuit 23 as shown in FIG. 1, and the scan line driver circuit 22 and the signal line driver circuit 23 are connected to a control circuit 24. Scan signals that switch on-off of the TFT 30 are supplied to the scan lines 14 from the scan line driver circuit 22 controlled by the control circuit 24. Also, display signals (applied voltages to pixel electrodes 12) are supplied to the plurality of signal lines 16 from the signal line driver circuit 23 controlled by the control circuit 24.

The opposite substrate 20 includes a color filter and a common electrode. In case of displaying three primary colors, the color filter includes an R (red) filter, a G (green) filter, and a B (blue) filter that are disposed corresponding to pixels. The common electrode is formed so as to cover the plurality of pixel electrodes 12. Liquid crystal molecules between the common electrode and the respective pixel electrodes 12 are oriented pixel by pixel according to a difference in potential between the two electrodes, thereby performing a display.

Figure 3:
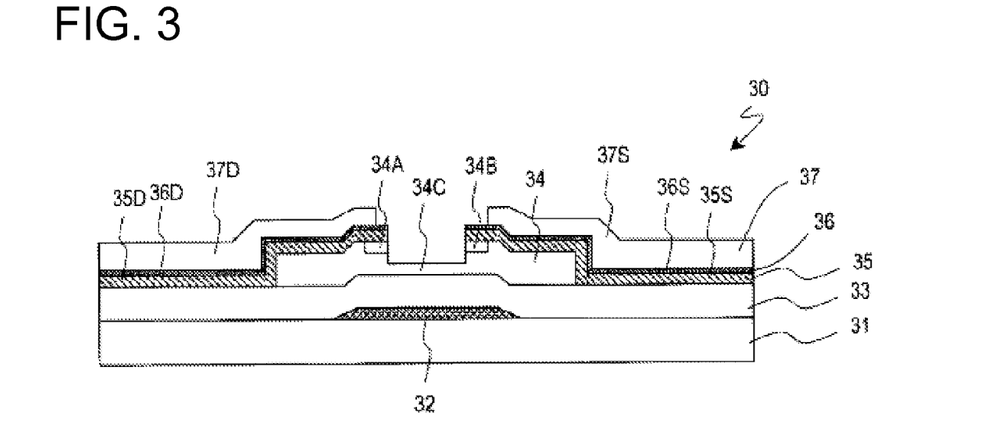
FIG. 3 is a schematic cross sectional view showing a configuration of a TFT 30 according to an embodiment of the present invention.

FIG. 3 is a schematic cross sectional view showing a configuration of the TFT 30 according to an embodiment of the present invention. As shown in FIG. 3, the TFT 30 is an inverse staggered type thin film transistor having the bottom gate structure. The TFT 30 has a gate electrode 32 formed on a substrate 31, a gate insulating layer 33 formed on the substrate 31 so as to cover the gate electrode 32, a silicon layer (semiconductor layer) 34 that is an active layer formed on the gate insulating layer 33, an N type silicon layer (semiconductor layer including impurities) 35 that is doped with impurities and formed on the silicon layer 34, a lower metal layer 36 formed on the N type silicon layer 35, and an upper metal layer 37 formed on the lower metal layer 36. A P type silicon layer can also be used as the silicon layer 35.

The silicon layer 34 includes a channel region 34C formed above the gate electrode 32, and low concentration impurity diffusion regions (hereinafter referred to as LD (Lightly Doped) regions) 34A and 34B formed on both sides of the channel region 34C. The channel region 34C is obtained by annealing (laser annealing) the silicon layer 34 that is formed as an amorphous silicon (a-Si) layer with a laser light irradiation so as to microcrystallize or polycrystallize the amorphous silicon. Also, the LD regions 34A and 34B are obtained as a result of the impurities included in the N type silicon layer 35 moving to the silicon layer 34 because of the thermal diffusion during the laser annealing.

A source region and a drain region of the TFT 30 are formed so as to sandwich the channel region 34C, and the N type silicon layer 35, the lower metal layer 36, and the upper metal layer 37 are separated into their respective source and drain regions. The N type silicon layer 35, the lower metal layer 36, and the upper metal layer 37 in the source region are a source contact layer 35S, a first source metal layer 36S, and a second source metal layer 37S, respectively. The N type silicon layer 35, the lower metal layer 36, and the upper metal layer 37 in the drain region are a drain contact layer 35D, a first drain metal layer 36D, and a second drain metal layer 37D, respectively.

The first source metal layer 36S and the second source metal layer 37S constitute a source electrode of the TFT 30, and the first drain metal layer 36D and the second drain metal layer 37D constitute a drain electrode of the TFT 30. The LD region 34A is located in the drain region and the LD region 34B is located in the source region.

An end portion of the second source metal layer 37S on a side of the channel region 34C is in a position receded from an end portion of the first source metal layer 36S on the channel region 34C side (position further away from the channel region 34C), and an end portion of the second drain metal layer 37D on the channel region 34C side is in a position receded from an end portion of the first drain metal layer 36D on the channel region 34C side. The LD region 34B is formed under a region adjacent to the end portions of the first source metal layer 36S and the source contact layer 35S on the channel region 34C side, and the LD region 34A is formed under a region adjacent to the end portions of the first drain metal layer 36D and the drain contact layer 35D on the channel region 34C side.

In other words, in the cross-sectional view that is perpendicular to the substrate surface, the LD region 34B is formed in a portion of the silicon layer 34 where the source contact layer 35S and the first source metal layer 36S are formed above, but the second source metal layer 37S is not formed above (which can include a slightly extended region), and the LD region 34A is formed in a portion of the silicon layer 34 where the drain contact layer 35D and the first drain metal layer 36D are formed above, but the second drain metal layer 37D is not formed above (which can include a slightly extended region). The LD regions 34A and 34B have a lower impurity concentration than the impurity concentration of the source contact layer 35S and the drain contact layer 35D.

Next, by referring to FIGS. 4(a) to 4(c) and FIGS. 5(a) and 5(b), a manufacturing method (Manufacturing Method 1) of the TFT 30 is described.

Figure 4:
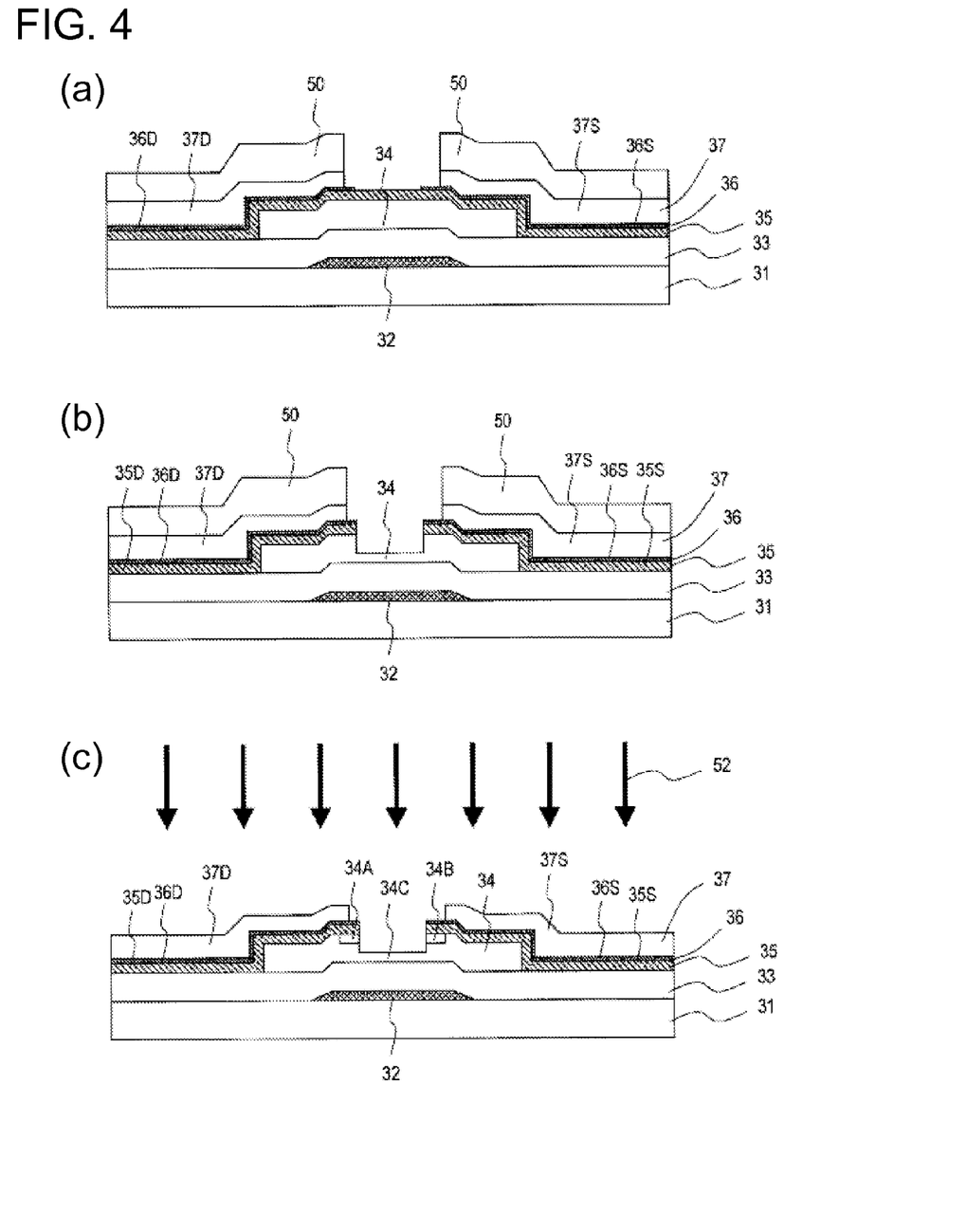
FIGS. 4(a) to 4(c) are cross sectional views for describing a manufacturing method of the TFT 30 according to an embodiment of the present invention.

In this manufacturing method, initially, a laminated structure shown in FIG. 4(a) is prepared. This laminated structure is obtained as follows.

First, a Ta (tantalum) layer, for example, is formed as a film on the substrate 31 by a sputtering method, and the gate electrode 32 is formed by patterning this layer using the photolithography. A dry etching method, for example, is used for etching, and the etching is performed by adding oxygen to an etching gas so that a photo resist gradually recedes during the etching. This way, a side surface of the gate electrode 32 can be made to have a 45° (taper angle of about 45°) slope with respect to the substrate surface.

A metal constituting the gate electrode 32 is not limited to Ta. For example, a single metal, such as aluminum (Al), indium tin oxide (ITO), tungsten (W), copper (Cu), chromium (Cr), molybdenum (Mo), titanium (Ti), or the like, or a material having nitrogen, oxygen or other metals added to such a metal may be used to form the gate electrode 32. Also, the gate electrode 32 may be a laminated structure by combining a plurality of layers of these materials.

Besides the sputtering method, a vapor deposition method or the like can be used as a film formation method of the gate electrode 32. Also, the etching method of a gate metal film is not specifically limited to the ones described above. A dry etching method or the like by combining chlorine ($Cl_2$) gas, boron trichloride ($BCl_3$) gas, and carbon tetrafluoride ($CF_4$) gas or the like can also be used.

Next, a silicon nitride film ($SiN_x$ film) that is to become the gate insulating layer 33 is formed as a film by the plasma CVD (Chemical Vapor Deposition) method, and an amorphous silicon layer is formed thereon. These films can be continuously formed in a multi-chamber type apparatus by the plasma CVD method. The thickness of the amorphous silicon layer is 50 to 500 nm. Thereafter, the silicon layer 34 having the shape as shown in FIG. 4(a) is obtained by patterning the amorphous silicon layer using the photolithography.

Next, the N type silicon layer 35 including phosphorus as an impurity, for example, is formed so as to cover the silicon layer 34 by the plasma CVD method. The thickness of the N type silicon layer 35 is 30 to 100 nm. In this step, the N type silicon layer 35 is formed as a film either by doping impurities after forming the N type silicon film, or by doping impurities before the film forming or during the film forming. Microcrystalline silicon, polycrystalline silicon, or amorphous silicon can be used for the N type silicon layer 35.

After this, the lower metal layer 36 is formed as a film with a thickness of 30 to 100 nm by laminating titanium (Ti) using the sputtering on the N type silicon layer 35. On the lower metal layer 36, the upper metal layer 37 is formed as a film with a 50 to 300 nm thickness by laminating aluminum (Al).

Next, a resist 50 is formed as a film on the upper metal layer 37, and the upper metal layer 37 and the lower metal layer 36 are patterned by wet etching using the resist 50 as a mask. Here, by adopting the wet etching and making the etching rate of the upper metal layer 37 higher than that of the lower metal layer 36, the end portion of the upper metal layer 37 is receded from the end portion of the lower metal layer 36. This way, the first source metal layer 36S and the second source metal layer 37S (source electrode), and the first drain metal layer 36D and the second drain metal layer 37D (drain electrode) that have the shape as shown in FIG. 4(a) can be obtained.

Figure 5:
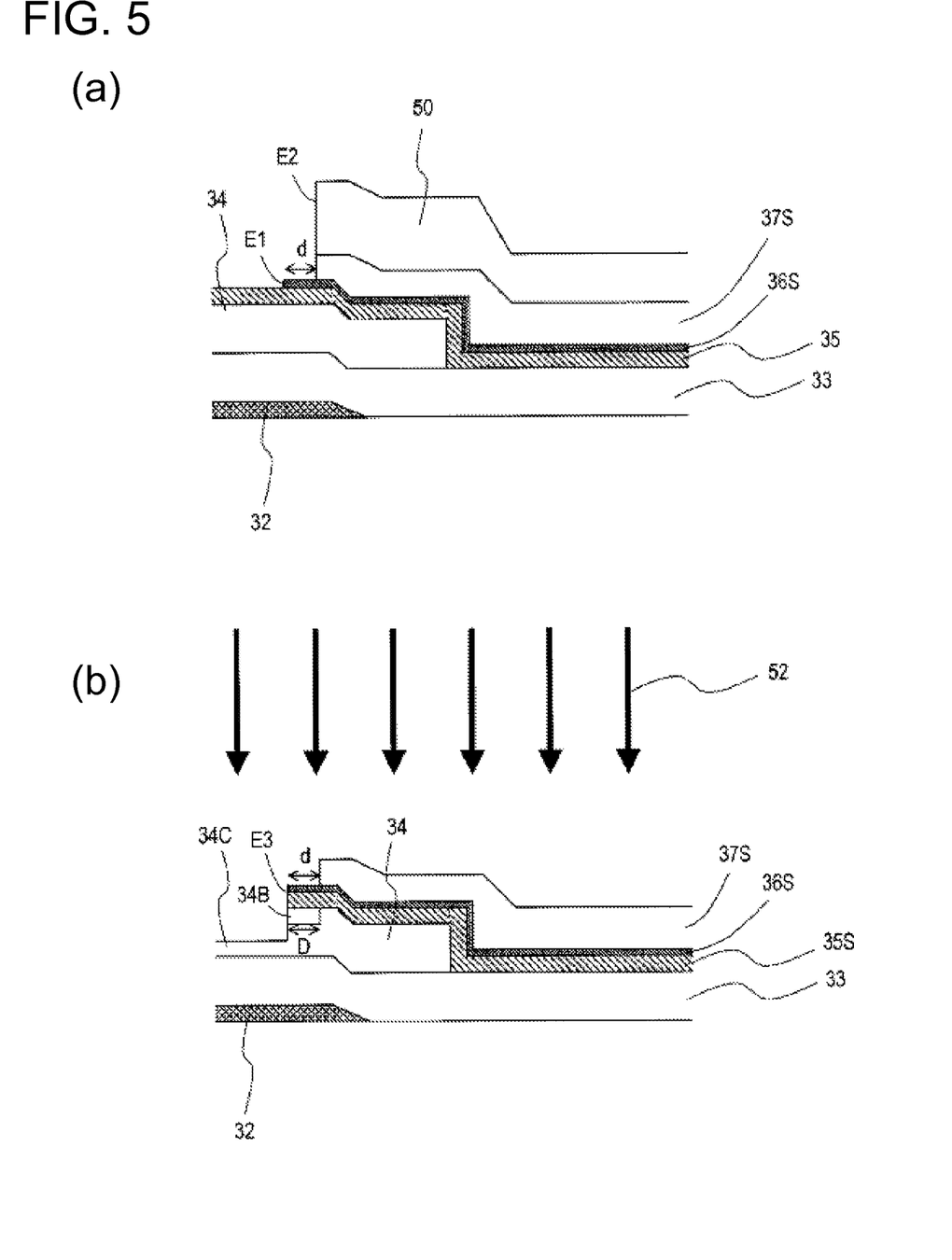
FIGS. 5(a) and 5(b) are cross sectional views showing a part of configuration of the TFT 30 according to an embodiment of the present invention.

The source electrode and its peripheral layer configuration are shown as enlarged in FIG. 5(a). A distance (offset) d between an end portion E1 of the first source metal layer 36S and an end portion E2 of the second source metal layer 37S is equal to or greater than 50 nm and is equal to or less than 200 nm. The offset between the first drain metal layer 36D and the second drain metal layer 37D is the same.

In order to obtain such an offset, besides titanium, molybdenum can be used for the lower metal layer 36. As for the upper metal layer 37, besides aluminum, copper or the like can be used. A fluoronitric acid solution is used as the etchant for titanium, and a phosphoric acid etchant is used for aluminum as the etchant. By using such metals, a good contact between the lower metal layer 36 and the N type silicon layer 35 becomes possible, and also, lowering of the resistivity of the metal layers becomes possible by using such an upper metal layer 37.

Next, leaving the resist 50 as it is, the source contact layer 35S and the drain contact layer 35D are separated from each other, as shown in FIG. 4(b), by forming a gap using dry etching of an exposed portion of the N type silicon layer 35 and an upper portion of the silicon layer 34

After this, following removal of the resist 50, irradiation is performed with laser light 52 by an excimer laser or the like from a side of the second source metal layer 37S and the second drain metal layer 37D, as shown in FIG. 4(c) and FIG. 5(b). By this irradiation with the laser light 52, the amorphous silicon in the central part of the silicon layer 34 is microcrystallized (or polycrystallized) and the channel region 34C of the silicon layer 34 is formed.

At this time, impurities in the N type silicon layer 35 are thermally diffused into the silicon layer 34. However, the thermal diffusion of the impurities occurs mainly from the parts of the N type silicon layer 35 that are not covered by the second source metal layer 37S and the second drain metal layer 37D. The reason for this is that due to the existence of the second source metal layer 37S and the second drain metal layer 37D, the parts of the N type silicon layer 35 that are underneath these layers are less likely to be heated by the laser light 52. This way, the LD regions 34A and 34B are formed in the silicon layer 34 near the end portions of the source contact layer 35S and the drain contact layer 35D. Respective widths D (depths from the end portions of the source contact layer and the drain contact layer or from an end portion E3 of the gap) of the LD regions 34A and 34B are equal to or greater than 50 nm. As described above, by selectively using an etchant depending on each material of the laminated metals, the offset can be controlled.

An excimer laser with the oscillation wavelength of 248 nm or 308 nm, for example, is used for the laser light 52. Irradiation energy of the laser light 52 is 200 to 500 mJ/cm², for example. Besides a pulsed laser, a CW (Continuous Wave) laser (continuous transmission laser) can be used for the laser light 52.

By the above described steps, the TFT 30 having the structure shown in FIG. 3 is formed. Occurrence of the leak current in the source region and the drain region is suppressed by the LD regions 34A and 34B of the TFT 30. Also, since the channel region 34C and the LD regions 34A and 34B can be formed by one laser irradiation, the TFT 30 can be manufactured efficiently. Also, since it is not necessary to change the direction of the laser irradiation in accordance with the orientation of each of the TFTs 30, there is an advantage that the manufacturing method of the present invention is easily applicable to a display device in which TFTs having different orientations are formed in the display region and its peripheral region, for example.

Next, by referring to FIGS. 6(a) to 6(d), Manufacturing Method 2 of the TFT 30 is described.

Figure 6:
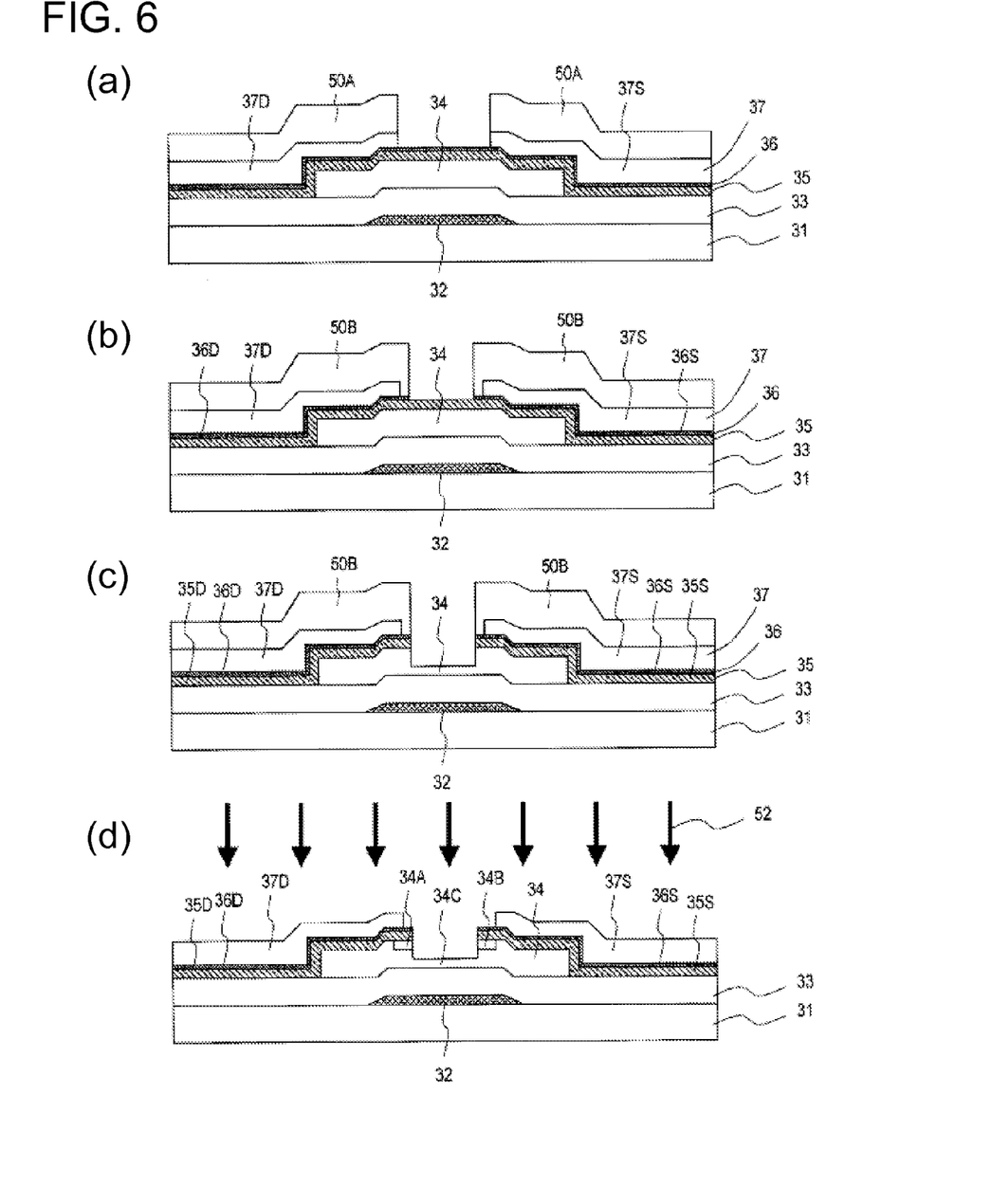
FIGS. 6(a) to 6(d) are cross sectional views for describing a second manufacturing method of the TFT 30 according to an embodiment of the present invention.

In Manufacturing Method 2, a laminated structure shown in FIG. 6(a) is prepared initially. This laminated structure is obtained as follows.

Initially, by using similar steps to Manufacturing Method 1, the gate electrode 32, the gate insulating layer 33, the silicon layer 34, the N type silicon layer 35, the lower metal layer 36, and the upper metal layer 37 are laminated on the substrate 31. Next, a photo resist 50A is formed as a film on the upper metal layer 37, and the upper metal layer 37 is patterned by etching using the photo resist 50A as a mask. This way, an opening of the upper metal layer 37 is formed above the gate electrode 32, as shown in FIG. 6(a), and the second source metal layer 37S and the second drain metal layer 37D that are separated from each other are formed.

Next, either by removing the photo resist 50A and forming a new photo resist, or by further forming a photo resist as a film on the photo resist 50A, a photo resist 50B having a narrower opening than that of the photo resist 50A is formed. After this, patterning of the lower metal layer 36 is performed using the photo resist 50B as a mask. Thereby, the laminated structure in which an offset is formed between the end portion of the first source metal layer 36S and the end portion of the second source metal layer 37S, and between the end portion of the first drain metal layer 36D and the end portion of the second drain metal layer 37D, as shown in FIG. 6(b), is obtained. This laminated structure has a similar configuration to the one shown in FIG. 5(a) except for the photo resist 50B.

Next, leaving the photo resist 50B as it is, a gap is formed by dry-etching the exposed part of the N type silicon layer 35 and the upper part of the silicon layer 34, thereby obtaining the source contact layer 35S and the drain contact layer 35D that are separated from each other, as shown in FIG. 6(c).

After this, following removal of the photo resist 50B, irradiation with the laser light 52 by the excimer laser or the like from the side of the second source metal layer 37S and the second drain metal layer 37D is performed, as shown in FIG. 6(d). By the irradiation with the laser light 52, the amorphous silicon in the central part of the silicon layer 34 is microcrystallized (or polycrystallized), thereby forming the channel region 34C in the silicon layer 34. Also, at this time, as described in Manufacturing Method 1, the impurities in the N type silicon layer 35 are thermally diffused into the silicon layer 34, thereby forming the LD regions 34A and 34B having the configuration, as shown in FIG. 6(d) and FIG. 5(b).

By the steps as describe above, the TFT 30 having the structure shown in FIG. 3 is formed. Occurrence of the leak current in the source region and the drain region is suppressed also in the TFT 30 that is formed by Manufacturing Method 2.

INDUSTRIAL APPLICABILITY

The present invention is suitably applicable to a display device such as a liquid crystal display device, an organic electroluminescence (EL) display device, an inorganic electroluminescence display device and the like, an imaging device such as a flat panel type X ray image sensor device and the like, and an image input device such as a contact type image input device, a fingerprint reading device and the like, that are provided with an active matrix substrate having a thin film transistor.

DESCRIPTION OF REFERENCE CHARACTERS 1 liquid crystal display device
10 TFT substrate
12 pixel electrode
14 scan line
15 liquid crystal layer
16 signal line
18 auxiliary capacitance line
20 opposite substrate
22 scan line driver circuit
23 signal line driver circuit
24 control circuit
26, 27 polarizing plates
28 backlight unit
30 TFT
31 substrate
32 gate electrode
33 gate insulating layer
34 silicon layer (semiconductor layer or first semiconductor layer)
34A, 34B low concentration impurity diffusion regions (LD regions)
34C channel region
35 N type silicon layer (semiconductor layer including impurities or second semiconductor layer)
35S source contact layer
35D drain contact layer
36 lower metal layer (first metal layer)
36S first source metal layer
36D first drain metal layer
37 upper metal layer (second metal layer)
37S second source metal layer
37D second drain metal layer
50 resist
50A, 50B photo resists
52 laser light

The invention claimed is:

1. A thin film transistor comprising:
a gate electrode formed on a substrate;
an insulating layer formed so as to cover the gate electrode;
a semiconductor layer that has a channel region made of a polycrystalline semiconductor or a microcrystalline semiconductor and that is formed on the insulating layer;
a source contact layer and a drain contact layer that are made of a semiconductor including impurities and that are formed on the insulating layer so as to contact the semiconductor layer;
a first source metal layer formed on the source contact layer;
a first drain metal layer formed on the drain contact layer;
a second source metal layer formed on the first source metal layer; and
a second drain metal layer formed on the first drain metal layer,
wherein an end portion of the second source metal layer on a side of the channel region is located at a position that is receded from an end portion of the first source metal layer on the side of the channel region,
wherein an end portion of the second drain metal layer on a side of the channel region is located at a position that is receded from an end portion of the first drain metal layer on the side of the channel region,
wherein the semiconductor layer contains low concentration impurity diffusion regions respectively formed adjacent to the end portions of the source contact layer and the drain contact layer on the side of the channel region, and wherein an impurity concentration of the low concentration impurity diffusion regions is lower than an impurity concentration of the source contact layer and the drain contact layer.

2. The thin film transistor according to claim 1, wherein at lease portions of the low concentration impurity diffusion regions are respectively formed between the end portion of the second source metal layer and the end portion of the first source metal layer, and between the end portion of the second drain metal layer and the end portion of the first drain metal layer as viewed in a direction normal to a surface of the substrate.

3. The thin film transistor according to claim 1, wherein a distance between the end portion of the first source metal layer and the end portion of the second source metal layer and a distance between the end portion of the first drain metal layer and the end portion of the second drain metal layer are equal to or more than 50 nm and equal to or less than 200 nm.

4. The thin film transistor according to claim 1, wherein a thickness of the first source metal layer and the first drain metal layer is equal to or greater than 30 nm and equal to or less than 100 nm.

5. The thin film transistor according to claim 1, wherein the first source metal layer and the first drain metal layer are made of titanium, and the second source metal layer and the second drain metal layer are made of aluminum.

6. A display device including a TFT substrate in which the thin film transistor according to claim 1 is disposed for each pixel.

7. A manufacturing method of a thin film transistor, comprising:

forming a gate electrode on a substrate;

forming an insulating layer so as to cover the gate electrode;

forming a first semiconductor layer on the insulating layer;

forming a second semiconductor layer including impurities on the first semiconductor layer;

forming a first metal layer on the second semiconductor layer;

forming a second metal layer on the first metal layer;

performing a pattering step that includes patterning the second metal layer so as to form a second source metal layer and a second drain metal layer, and patterning the first metal layer so as to form a first source metal layer and a first drain metal layer;

patterning the second semiconductor layer so as to form a source contact layer underneath the first source metal layer, and to form a drain contact layer underneath the first drain metal layer, respectively; and irradiating the first semiconductor layer with light from a side of the second metal layer so as to form a channel region made of a polycrystalline semiconductor or a microcrystalline semiconductor in the first semiconductor layer, wherein in the patterning step, an end portion of the second source metal layer is formed at a position receded from an end portion of the first source metal layer on a side of the channel region, and an end portion of the second drain metal layer is formed at a position receded from an end portion of the first drain metal layer on a side of the channel region, wherein in the light irradiating step, low concentration impurity diffusion regions are respectively formed in the first semiconductor layer underneath the source contact layer and the drain contact layer, and wherein an impurity concentration of the low concentration impurity diffusion regions is lower than an impurity concentration of the source contact layer and the drain contact layer.

8. The manufacturing method according to claim 7, wherein the first metal layer and the second metal layer are patterned in the patterning step so that a distance between the end portion of the first source metal layer and the end portion of the second source metal layer, and a distance between the end portion of the first drain metal layer and the end portion of the second drain metal layer are equal to or greater than 50 nm and equal to or less than 200 nm.

9. The manufacturing method according to claim 7, wherein the second source metal layer, the second drain metal layer, the first source metal layer, and the first drain metal layer are formed by etching the second metal layer and the first metal layer in one wet etching treatment in the patterning step.

10. The manufacturing method according to claim 9, wherein the first source metal layer and the first drain metal layer are made of titanium, and the second source metal layer and the second drain metal layer are made of aluminum.

11. The manufacturing method according to claim 7, wherein the patterning step includes:

a first step of forming the second source metal layer and the second drain metal layer from the second metal layer by photolithography; and a second step of forming the first source metal layer and the first drain metal layer from the first metal layer by photolithography.

* * * * *